(12) United States Patent
Tyan

(10) Patent No.: US 7,205,812 B1
(45) Date of Patent: Apr. 17, 2007

(54) HYSTERISIS MANAGEMENT FOR DELAY LINE

(75) Inventor: Eer-Wen Tyan, Hsinchu (TW)

(73) Assignee: Advanced Micro Devices, Inc., Sunnyvale, CA (US)

( * ) Notice: Subject to any disclaimer, the term of this patent is extended or adjusted under 35 U.S.C. 154(b) by 36 days.

(21) Appl. No.: 11/147,003

(22) Filed: Jun. 7, 2005

(51) Int. Cl.
 *H03H 11/26* (2006.01)
(52) U.S. Cl. .................................. 327/262; 327/261
(58) Field of Classification Search ............... 327/270, 327/276, 362, 261–264
 See application file for complete search history.

(56) References Cited

U.S. PATENT DOCUMENTS

| | | | |
|---|---|---|---|
| 5,402,125 A | | 3/1995 | Distinti |
| 5,469,476 A | | 11/1995 | Liao et al. |
| 5,867,545 A | * | 2/1999 | Ogasawara ............... 375/376 |
| 6,008,680 A | * | 12/1999 | Kyles et al. .............. 327/277 |
| 6,121,815 A | * | 9/2000 | Terada et al. ............. 327/292 |

\* cited by examiner

*Primary Examiner*—Dinh T. Le
(74) *Attorney, Agent, or Firm*—Meyertons Hood Kivlin Kowert & Goetzel, P.C.; B. Noël Kivlin

(57) ABSTRACT

A method and apparatus for managing hysterisis in a delay line. In one embodiment, an integrated circuit includes a delay line. A selection circuit is coupled to an input of the delay line. The selection circuit includes two inputs: a first input coupled to convey a signal such as a data signal or a data strobe signal, while the second input is coupled to convey a dummy clock signal. Control logic is coupled to monitor activity within the delay line. Upon detecting a lack of activity for a predetermined time period, the control logic is configured to cause the selection circuit to allow the dummy clock signal to be conveyed to the input of the delay line.

18 Claims, 4 Drawing Sheets

HYSTERISIS MANAGEMENT FOR DELAY LINE

BACKGROUND OF THE INVENTION

1. Field of the Invention

This invention relates to electronic circuits, and more particularly, to delay line circuits.

2. Description of the Related Art

In many complex digital systems, there often exists a need for providing delay lines. Delay lines may be useful for such tasks as providing a phase delay to align the edges of a clock signal or providing a delay for a signal in order to synchronize it with another signal. Delay lines may be particularly useful in areas where multiple signals encountering differing propagation delays on their respective signal paths must be synchronized.

Delay lines are used in a wide variety of applications, and have many different implementations. Integrated circuits may include delay lines that are implemented in the silicon die. The performance of delay lines implemented on a silicon die may depend on the silicon technology used. One silicon technology that is commonly used today is known as silicon-on-insulator (SOI). FIG. 1 illustrates an SOI transistor. In the embodiment shown, insulating material is embedded in the body of the silicon. The presence of the insulator electrically decouples the portion of the body immediately beneath the transistor terminals from the remainder of the body that is coupled to electrical ground. Thus, the voltage in the body immediately beneath the transistor terminals floats due to capacitance between itself and the portion of the body coupled to ground.

A key objective in implementing a delay line is the ability of the delay line to provide a consistent and predictable delay time. However, this objective may be difficult to achieve in a delay line implemented using SOI technology. Due to the floating voltage of the body immediately beneath the transistor terminals and the capacitance between that portion of the body and the portion that is electrically coupled to ground, hysterisis may develop, particularly if the delay line is inactive for a certain amount of time. This hysterisis, when multiplied over the number of transistors used to implement the delay line, can cause a significant variation and inconsistency in the delay time provided by the delay line.

SUMMARY OF THE INVENTION

A method and apparatus for managing hysterisis in a delay line is disclosed. In one embodiment, an integrated circuit includes a delay line. A selection circuit is coupled to an input of the delay line. The selection circuit includes two inputs: a first input coupled to convey a signal such as a data signal or a data strobe signal, while the second input is coupled to convey a dummy clock signal. Control logic is coupled to monitor activity within the delay line. Upon detecting a lack of activity for a predetermined time period, the control logic is configured to cause the selection circuit to allow the dummy clock signal to be conveyed to the input of the delay line.

In one embodiment, the integrated circuit is fabricated using a silicon-over-insulator process wherein a portion of the body of the integrated circuit is isolated from electrical ground by an insulator. However, the method and apparatus may be implemented on integrated circuits fabricated using other processes as well, and may be particularly useful in integrated circuits where hysterisis can affect the switching speed of transistors that are inactive for certain time periods.

BRIEF DESCRIPTION OF THE DRAWINGS

Other aspects of the invention will become apparent upon reading the following detailed description and upon reference to the accompanying drawings in which.

Figure 1:
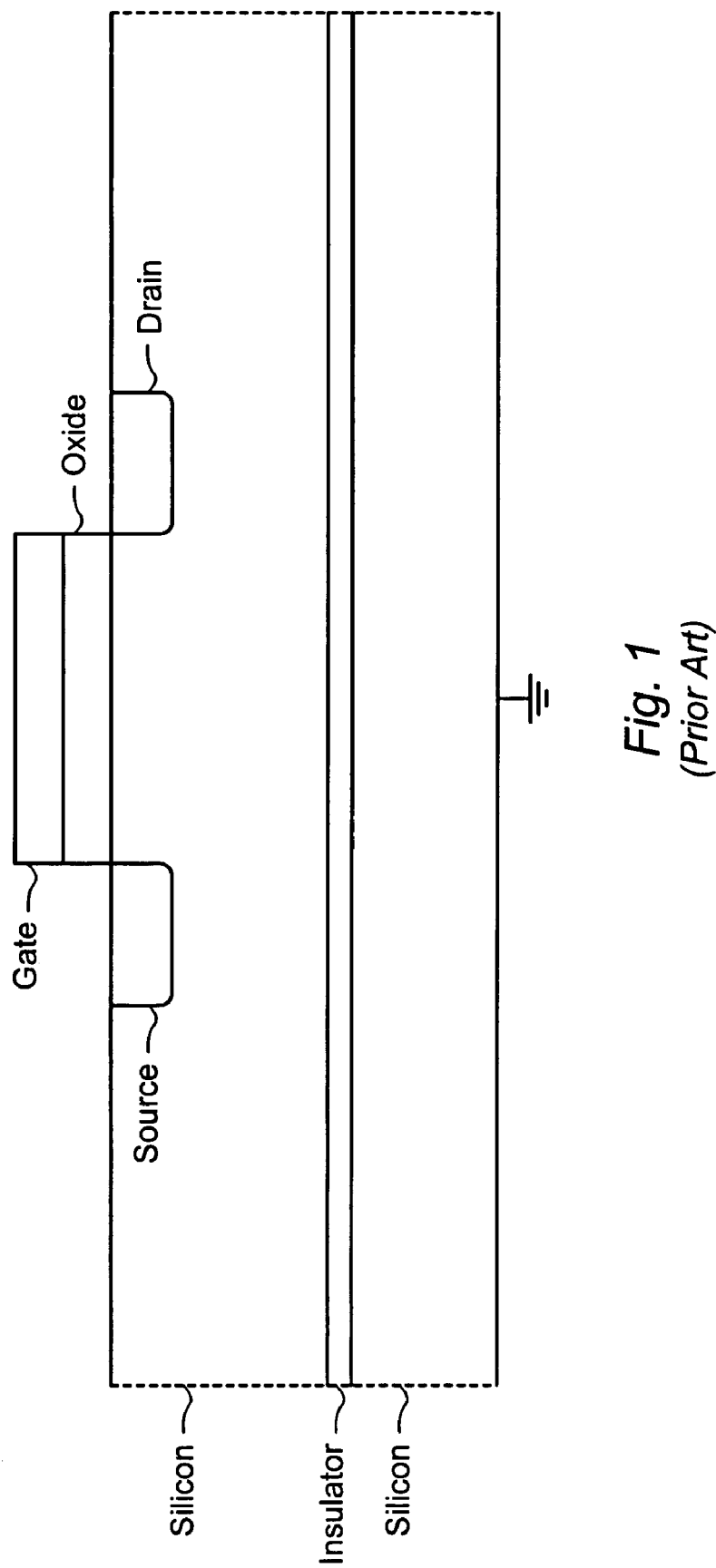
FIG. 1 (Prior Art) is a drawing of one embodiment of a transistor implemented on silicon-over-insulator (SOI) technology.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Figure 2:
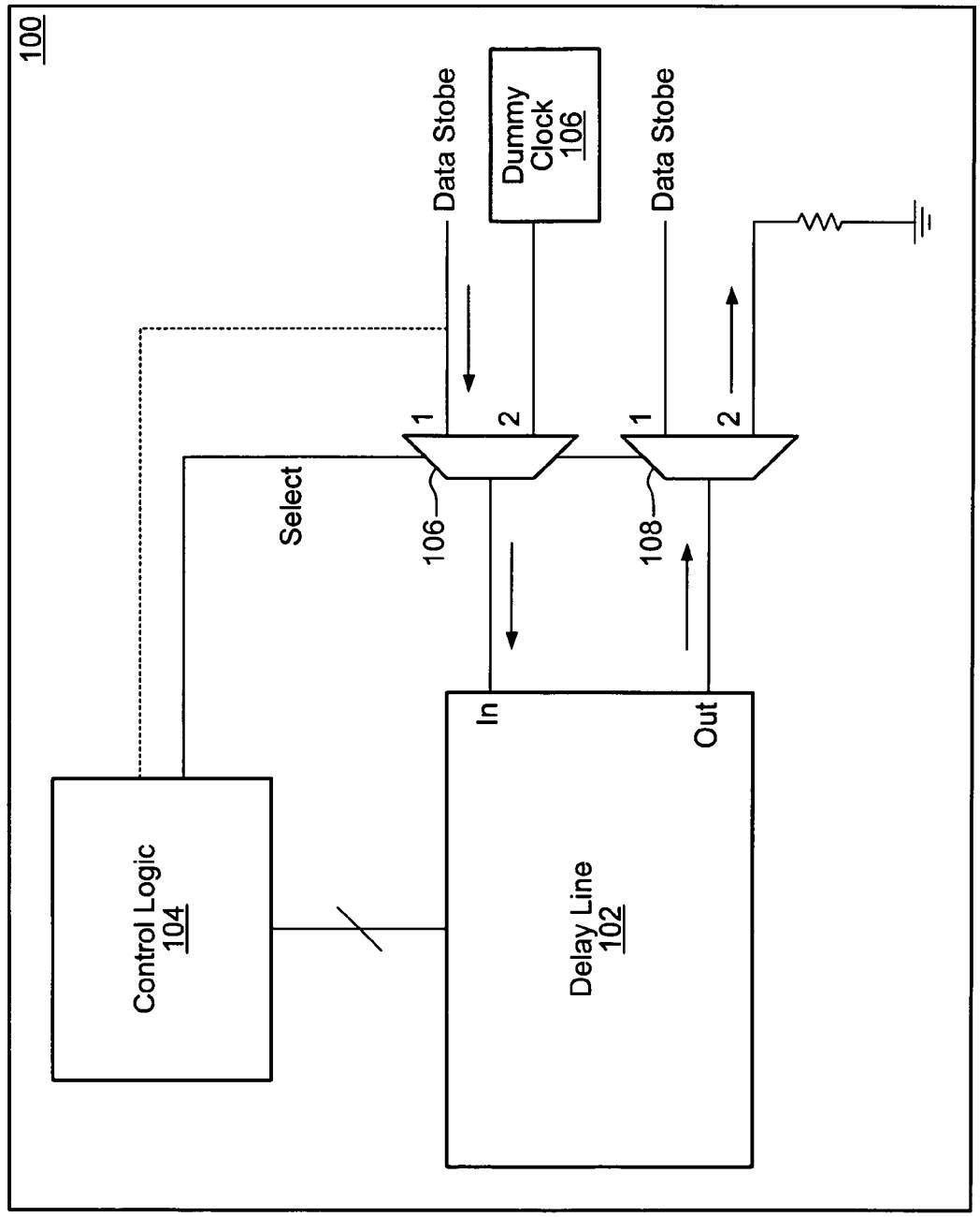
FIG. 2 is a block diagram of one embodiment of an integrated circuit including a programmable delay line and control logic configured to monitor activity in the delay line.

Turning now to FIG. 2, a block diagram of one embodiment of an integrated circuit including a programmable delay line and control logic configured to monitor activity in the delay line is shown. In the embodiment shown, integrated circuit 100 includes delay line 102. Delay line 102 may be a programmable delay line (thereby having a variable delay) or may be a fixed delay line, having a fixed delay time. In embodiments where it is variable, the delay may be set by control logic 104. The internal construction of delay line 102 may be any that is suitable for a delay circuit. In one embodiment, delay line 102 may be implemented using a serially coupled chain of inverters, while in another embodiment delay line 102 is implemented using a serially coupled chain of buffers. Delay line 102 may also include any switching circuitry that is necessary to alter the signal path in embodiments where delay line 102 is programmable.

Selection circuits are coupled to both the input and output of delay line 102. In the embodiment shown here, multiplexer 106 is coupled to the input of delay line 102, while a demultiplexer 108 is coupled to its output. Multiplexer 106 is coupled to select either a data strobe signal on a first input, or a dummy clock signal on a second input (it is noted that the data strobe signal is exemplary, and other types of signals may be input to the delay line through multiplexer 106).

Control logic 104 is coupled to selection circuit 106. More particularly, control logic 104 is configured to control the state of the selection signal ('select') that is provided to multiplexer 106, as well as demultiplexer 108. During normal operations (i.e. when the data strobe or other signal conveyed via the first input to multiplexer 106 is active), control logic 104 is configured to set the selection signal such that the first input is selected (for the sake of convenience, the first and second inputs/outputs are labeled '1' and '2' here, respectively). Similarly, since the selection signal is also provided to demultiplexer 108, the first output (labeled data strobe) is selected during normal operations. Control logic 104 may also provide control functions over delay line 102 in embodiments where the delay line is programmable. For example, control logic 104 may be configured to set the desired delay time for a signal propagating through delay line 102 as well as adjusting the delay time if necessary.

In addition to the functions discussed above, control logic 104 is also configured to monitor activity in the delay line. In the embodiment shown, control logic 104 is coupled to a signal input of multiplexer 106 (as shown by the dashed line) and thus detects activity at that point. In other embodiments, control logic 104 may detect activity in another point within or associated with delay line 102. If control logic 104 detects a lack of activity for predetermined period of time, it may shift the state of the select signal to select the second input, thereby allowing the dummy clock signal to propagate into the delay line. The dummy clock signal essentially keeps delay line 102 active in order to prevent the build-up of hysterisis. The prevention of hysterisis build-up may be particularly important when integrated circuit 100 is fabricated using technologies such as the silicon-over-insulator (SOI) process. In one embodiment, integrated circuit 100 is fabricated using the SOI process, although the apparatus shown here may be implemented on integrated circuits fabricated using other processes. The prevention of hysterisis in delay line 102 may ensure that the delay time (whether fixed or programmed) is predictable and repeatable.

As previously noted, demultiplexer 108 is coupled to the output of delay line 102, and is also coupled to receive a select signal from control logic 104. This select signal may be the same select signal as that received by multiplexer 106, although additional delay elements (not shown here) may be present in some embodiments in order to cause the change in state of the select signal to be received at a later time by demultiplexer 108. When the state of the select signal is changed to allow the dummy clock to propagate into the delay line, the selected output of demultiplexer 108 will also change, either at the same time as the select signal received by multiplexer 106, or after some delay if the apparatus is so configured. After the change of state of the select signal, the dummy clock signal will propagate though the second output of demultiplexer 108, with its energy drained to ground through the resistor shown in the drawing. This termination may be different for other embodiments, as may be the routing of the dummy clock signal. For the embodiment shown, this scheme is designed to prevent the dummy clock signal from adversely affecting other circuitry that may be coupled to receive the signal (e.g., the data strobe signal) that is conveyed through delay line 102 during normal operations. During normal operations, the signal received from the output of delay line is propagated through the first input.

If control logic 104 detects a resumption of activity, it may set the selection signal to select the first input for multiplexer 106 and the first output of demultiplexer 108. This selection will prevent the dummy clock from propagating through the delay line and will also allow the data strobe signal (or other type of signal) to be conveyed through the first input of multiplexer 106, through delay line 102, and through the first output of demultiplexer 108.

Figure 3:
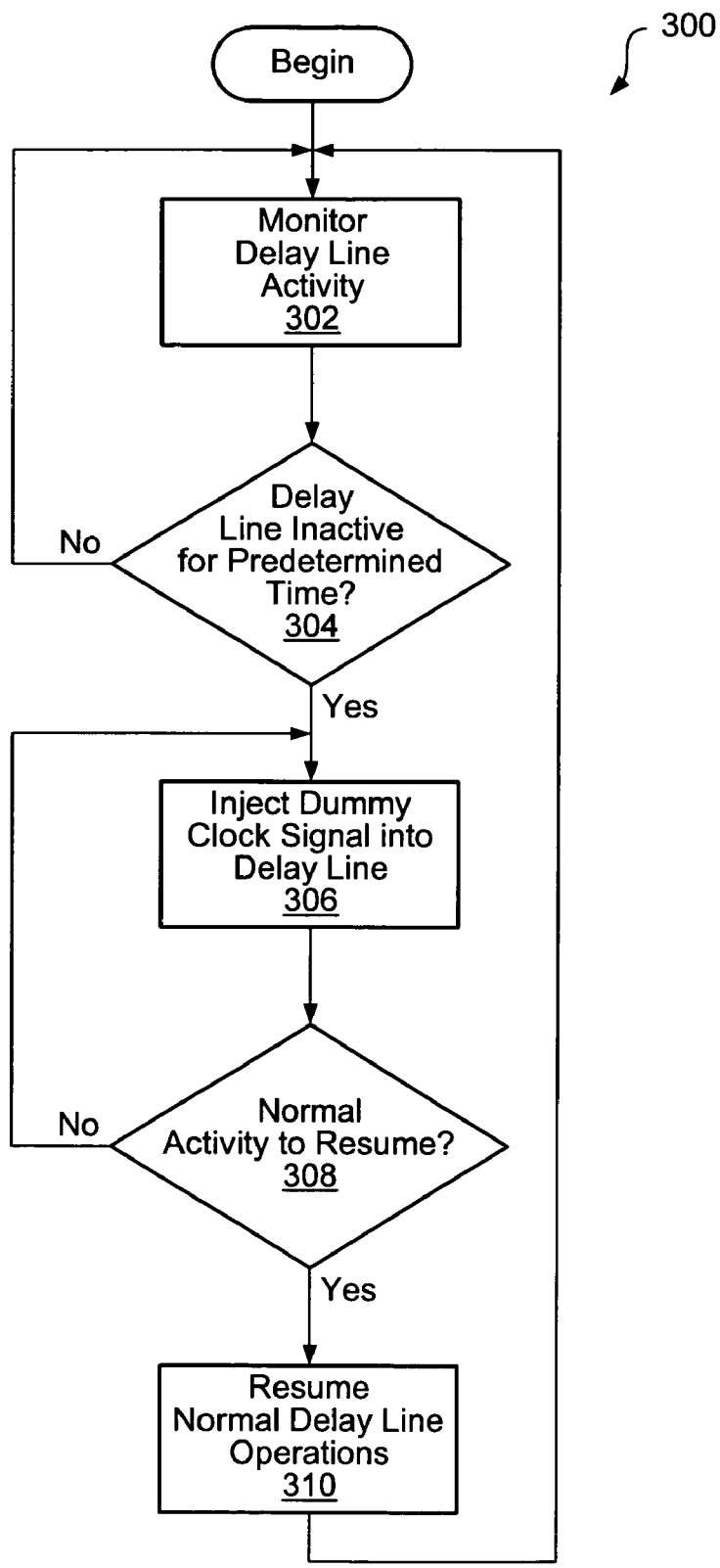
FIG. 3 is a flow diagram of one embodiment of a method for managing hysterisis in a delay line.

Moving now to FIG. 3, a flow diagram of one embodiment of a method for managing hysterisis in a delay line is shown. The method may be applied to the embodiment shown in FIG. 2 and any equivalents thereof.

In the embodiment shown, method 300 begins by monitoring the activity of a delay line (302). In one embodiment, the activity of the delay line may be monitored by checking for activity on one of its inputs. The activity monitored is that of the signal that is intended to be conveyed through the delay lines during normal operations. This signal may be a clock signal, a data strobe signal, a data signal, or any other type of signal where a delay may be necessary.

Other methods of monitoring activity are possible and contemplated as well, including monitoring the source of the signal that is to be injected into the delay line. Broadly speaking, monitoring may comprise any operation that may be used to determine the activity of the signal intended to be conveyed through the delay line, regardless of how that operation is performed.

Monitoring the delay line includes measuring the amount of time elapsed from the most recent activity. For certain types of signals (e.g., a data strobe signal), the signals may only be active at certain times, such as during the read or a write to a memory, while remaining inactive during other times. When measuring the amount of time elapsed from the most recent activity, the elapsed time is compared to a predetermined time period (304). If the elapsed time is less than the predetermined time period, monitoring continues with no change to the operation. However, if the elapsed time since the last activity exceeds the predetermined time period, a dummy clock signal is injected into the delay line (306). The dummy clock signal may take on various forms, and need not be a clock signal with a 50% duty cycle. In general, the dummy clock signal can be any signal that switches states (e.g., high to low or low to high) frequently enough to prevent the build-up of hysterisis in the delay line.

Even after the injection of the dummy clock signal into the delay line, monitoring for activity of the intended signal (i.e. 'normal' activity) continues. If normal activity does not resume (308, no), the dummy clock signal will continue to be conveyed through the delay line. However, if it is detected that normal activity is to resume (308, yes), the normal delay line operations are resumed, while the injection of the dummy clock signal into the delay line is halted. After the resumption of normal operation, monitoring as in 302 resumes, including determining the elapsed time since the most recent activity of the intended signal and comparing this elapsed time with a predetermined time.

Figure 4:
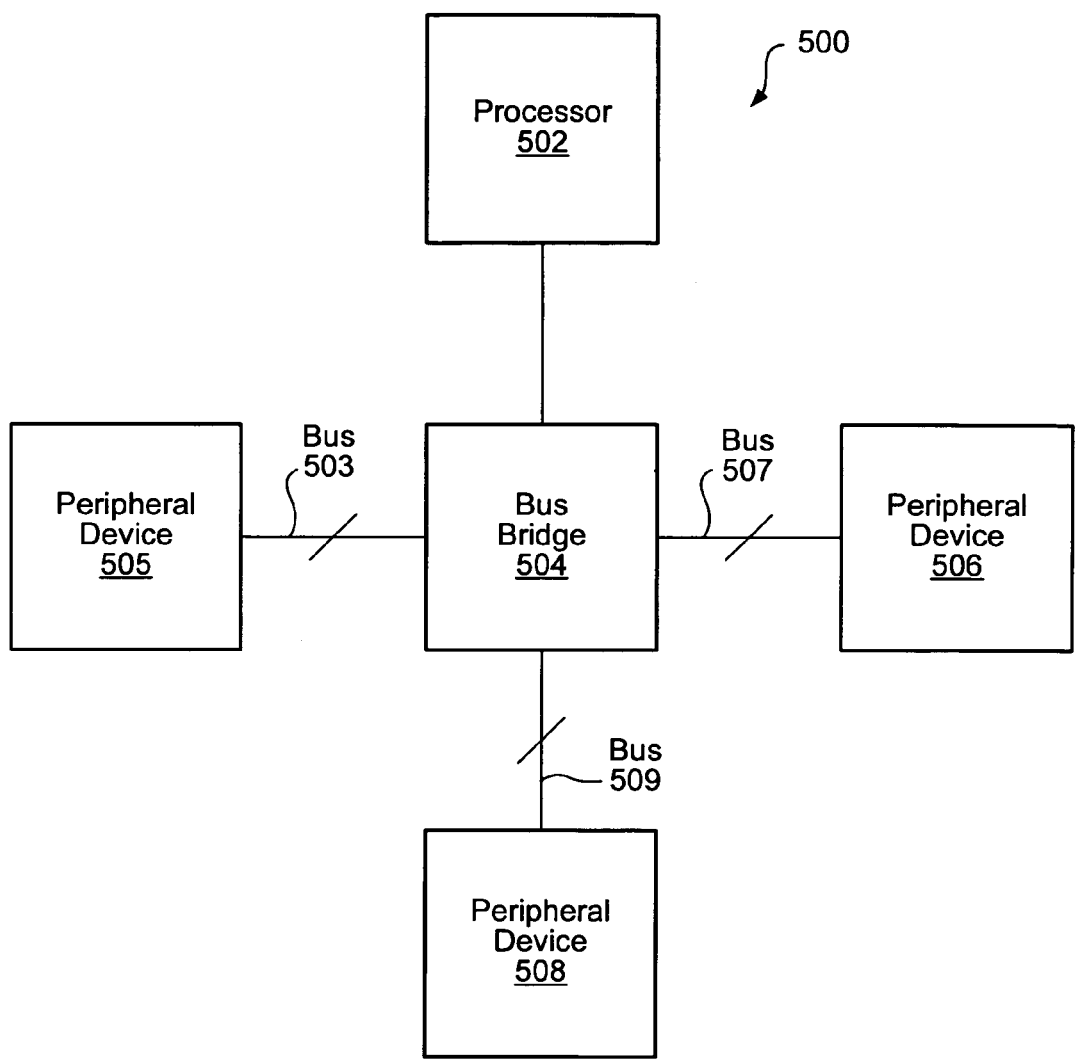
FIG. 4 is a block diagram of one embodiment a computer system having at least one integrated circuit.

FIG. 4 is a block diagram of one embodiment a computer system having at least one integrated circuit. The integrated circuit may be the embodiment shown in FIG. 2 or an equivalent thereof, and thus may include a delay line along with control logic that monitors delay line activity. The integrated circuit may also include a selection circuit controlled by the control logic, which allow a dummy clock signal to be injected into the delay line when the intended (i.e. normal) signal is inactive for a predetermined period of time.

In the embodiment shown, computer system 500 includes processor 502, which is coupled to bus bridge 504. Both processor 502 and bus bridge 504 may be implemented as integrated circuits, and may each contain one or more delay lines in a configuration such as FIG. 2 (or equivalent), including control logic, selection circuits, and a dummy clock generator. Computer system 500 may include other integrated circuits as well and these additional integrated circuits may also include the delay line configuration discussed herein.

Bus bridge 504, in this embodiment, is coupled to peripheral devices 505, 506, and 508, via buses 503, 507, and 509, respectively. These peripheral devices may be any type of peripheral device that may be used with computer system 500. Such peripheral devices include (but are not limited to)

printers, optical drives, network cards, wireless networking adapters, game controllers, scanners, and so forth.

Computer system 500 is an exemplary embodiment of a computer system, and it is noted that the integrated circuits discussed herein may be implemented in other types of computer systems as well. Furthermore, these integrated circuits may be implemented in other electronic systems that fall outside of the scope of computer systems.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. An integrated circuit comprising:
   a delay line;
   a selection circuit coupled to the delay line, the selection circuit having a first input and second input and an output coupled to a delay line input, wherein the first input is coupled to receive a first signal and wherein the second input of the selection circuit is coupled to convey a dummy clock signal; and
   control logic coupled to the delay line, wherein the control logic is configured to monitor activity in the delay line, and responsive to detecting a lack of activity for a predetermined time, to configure the selection circuit to convey the dummy clock signal to the input of the delay line by selecting the second input.

2. The integrated circuit as recited in claim 1, wherein the control logic is configured to monitor the first input of the selection circuit and to select the first input responsive to detecting activity on the first input.

3. The integrated circuit as recited in claim 2, wherein the first input of the selection circuit is coupled to convey a data strobe signal to the delay line input.

4. The integrated circuit as recited in claim 2, wherein the first input of the selection circuit is coupled to convey a data signal to the delay line input.

5. The integrated circuit as recited in claim 1, wherein the delay line is a programmable delay line.

6. The integrated circuit as recited in claim 5, wherein the control logic is configured to select a delay time for the delay line.

7. The integrated circuit as recited in claim 1, wherein the integrated circuit is fabricated using a silicon-on-insulator process.

8. The integrated circuit as recited in claim 1 further comprising a demultiplexer coupled to an output of the delay line, wherein the demultiplexer includes a first output and a second output, and wherein the second output is coupled to convey the dummy clock signal, and wherein the control logic is configured to select the second output responsive to detecting the lack of activity on the delay line for the predetermined period of time.

9. The integrated circuit as recited in claim 1, wherein the control logic is configured to convey a selection signal to the selection circuit in order to select the first signal to be conveyed to the input of the delay line responsive to detecting activity on the first input.

10. A method comprising:
    monitoring activity in a delay line, wherein the delay line is coupled to receive a first signal or a second signal via a selection circuit, wherein the second signal is a dummy clock signal;
    configuring the selection circuit to convey the dummy clock signal to an input of the delay line responsive to detecting a lack of activity in the delay line for a predetermined period of time.

11. The method as recited in claim 10, wherein said monitoring activity in the delay line comprises monitoring activity on the first input of the selection circuit.

12. The method as recited in claim 11, wherein the first signal is a data strobe signal.

13. The method as recited in claim 11, wherein the first signal is a data signal.

14. The method as recited in claim 11 further comprising configuring the selection circuit to convey the first signal to the input of the delay line responsive to detecting activity on the first input of the selection circuit.

15. The method as recited in claim 10, wherein the delay line is a programmable delay line.

16. The method as recited in claim 15 further comprising control logic selecting a delay time for the delay line.

17. The method as recited in claim 10, wherein the delay line and the control logic are implemented on an integrated circuit fabricated using a silicon-on-insulator process.

18. A system comprising:
    at least one integrated circuit, wherein the integrated circuit includes:
    a delay line;
    a selection circuit coupled to the delay line, the selection circuit having a first input and second input and an output coupled to a delay line input, wherein the first input is coupled to receive a first signal and wherein the second input of the selection circuit is coupled to convey a dummy clock signal; and
    control logic coupled to the delay line, wherein the control logic is configured to monitor activity in the delay line, and responsive to detecting a lack of activity for a predetermined time, to configure the selection circuit to convey the dummy clock signal to the input of the delay line by selecting the second input.

* * * * *